United States Patent [19]
Hirabayashi

[11] Patent Number: 5,376,564
[45] Date of Patent: Dec. 27, 1994

[54] METHOD OF MANUFACTURING A BIPOLAR TRANSISTOR HAVING A DECREASED COLLECTOR-BASE CAPACITANCE

[75] Inventor: Hiroshi Hirabayashi, Tokyo, Japan
[73] Assignee: NEC Corporation, Tokyo, Japan
[21] Appl. No.: 220,918
[22] Filed: Mar. 31, 1994
[30] Foreign Application Priority Data
Apr. 1, 1993 [JP] Japan .................................. 5-75976
[51] Int. Cl.$^5$ ........................................... H01L 21/265
[52] U.S. Cl. ............................. 437/31; 437/162; 437/164; 437/909; 148/DIG. 11; 148/DIG. 124
[58] Field of Search ................ 437/31, 162, 164, 909; 148/DIG. 10, DIG. 11, DIG. 123, DIG. 124

[56] References Cited
U.S. PATENT DOCUMENTS

| | | | |
|---|---|---|---|
| 5,089,430 | 2/1992 | Owada et al. | 437/162 |
| 5,162,244 | 11/1992 | Lim | 437/31 |
| 5,227,317 | 7/1993 | Owada et al. | 437/31 |

FOREIGN PATENT DOCUMENTS

| | | | |
|---|---|---|---|
| 0002362 | 1/1989 | Japan | 437/31 |

OTHER PUBLICATIONS
By K. Ueno et al., "A Sub-40 PS ECL Circuit at a Switching Current of 1.28 MA", IEEE, 1987, pp. 371-374.

Primary Examiner—Brian E. Hearn
Assistant Examiner—Tuan Nguyen
Attorney, Agent, or Firm—Young & Thompson

[57] ABSTRACT

On manufacturing a bipolar transistor, a field silicon oxide layer (7) having a beaked edge portion (bird's beak portion) is formed by a heat oxidation process using a silicon nitride film (5) as an oxidation mask. In this event, an edge of the nitride film is boosted up as a boosted portion by an upper part of the beaked edge portion. The upper part of the beaked edge portion is etched to form an undercut portion under the boosted portion. The undercut portion is filled with a base leading polysilicon (10) having impurities. On forming an insulator film (11) on the base leading polysilicon in a heated atmosphere, an outer base region (14) is formed in an epitaxial layer (3) by making the impurities diffuse from the base leading polysilicon towards the epitaxial layer in the heated atmosphere. Between the epitaxial layer and an edge portion of a nonboosted portion of the nitride film, a silicate glass (12) containing impurities is buried. The silicate glass (12) containing impurities is buried under the nitride film through an opening to form an inner base region (13) on the inside of the outer base region by diffusion of the impurities. The silicate glass is removed except an edge portion thereof which forms a link base region (15) by diffusion of the impurities. A hole of an insulator spacer (16) formed in the opening is filled with an emitter leading polysilicon (17) having impurities used in forming an emitter region (19) by diffusion.

14 Claims, 15 Drawing Sheets

METHOD OF MANUFACTURING A BIPOLAR TRANSISTOR HAVING A DECREASED COLLECTOR-BASE CAPACITANCE

BACKGROUND OF THE INVENTION

This invention relates to a method of manufacturing a semiconductor device comprising a bipolar transistor element. This invention relates also to the semiconductor device.

As will later be described, a conventional semiconductor device of the type described, inevitably has an increased collector-base capacitance $C_{CB}$. This is because a base leading polysilicon member is brought into contact with a large area of a planar surface of a base layer in the manner which will also later be described.

Another conventional semiconductor device is disclosed by Katsunobu Ueno et al in CH2515-5 (1987) pages IEDM87-371 to 374-IEDM87 (published by IEEE), under the title of "A SUB-40 PS ECL Circuit at a Switching Current of 1.28MA". In the Ueno et al device, a bipolar transistor also has an increased collector-base capacitance for the similar reason.

SUMMARY OF THE INVENTION

It is therefore an object of this invention to provide a method capable of manufacturing a semiconductor device having a decreased collector-base capacitance ($C_{CB}$).

It is another object of this invention to provide a method of the type described, which is capable of manufacturing the semiconductor device having a high cutoff frequency ($f_T$).

Other objects of this invention will become clear as the description proceeds.

On describing the gist of this invention, it is possible to understand that a method is for manufacturing a semiconductor device comprising a bipolar transistor element including a collector region, a base region, and an emitter region, each of the collector and the emitter regions being of a first conductivity type, the base region being of a second conductivity type which is different from the first conductivity type.

According to this invention, the above-understood method comprises (a) preparing a semiconductor member which comprises a semiconductor substrate of the second conductivity type having a substrate surface, a semiconductor layer of the first conductivity type having a principal surface and an opposite surface opposite to the principal surface, and the collector region interposed between the substrate surface and the opposite surface; (b) forming on the principal surface a thin semiconductor oxide film of a predetermined film thickness; (c) selectively forming a semiconductor nitride film on a selected part of the thin semiconductor oxide film with a remaining part of the thin semiconductor oxide film exposed as an exposed part; (d) subjecting the exposed part of the thin semiconductor oxide film to an oxidation treatment by making use of the semiconductor nitride film as an oxidation mask to change the exposed part to a thick field semiconductor oxide layer of a predetermined layer thickness greater than the predetermined film thickness so that the thick field semiconductor oxide layer has a beaked edge portion with a nitride edge portion of the semiconductor nitride film boosted up as a boosted portion by an upper part of the beaked edge portion and with a remaining portion of the semiconductor nitride film kept as a nonboosted portion as it stands and that the thin semiconductor oxide film which exists under the nonboosted portion and is surrounded by the beaked edge portion is kept unchanged as a thin oxide film; (e) selectively etching the upper part of the beaked edge portion and an oxide edge portion of the thin oxide film by making use of the semiconductor nitride film having the boosted portion as an etching mask to form a first undercut portion under the boosted portion and over the principal surface with a remaining portion of the thin oxide film kept unetched as an unetched thin oxide film; (f) forming a base leading polysilicon member with the semiconductor nitride film and the thick field semiconductor oxide layer covered with the base leading polysilicon member and with the first undercut portion filled with the base leading polysilicon member, the base leading polysilicon member being doped with impurities of the second conductivity type; (g) forming an insulator film on the base leading polysilicon member in a first heated atmosphere to thereby form an outer base region in the semiconductor layer by making the impurities of the second conductivity type diffuse from the base leading polysilicon member to the outer base region through the principal surface in the first heated atmosphere; (h) selectively etching a predetermined insulator portion of the insulator film, a predetermined polysilicon portion of the base leading polysilicon member, and a central portion of the nonboosted portion of the semiconductor nitride film to form an opening, an edge portion of the nonboosted portion being kept unetched, the predetermined insulator portion and the predetermined polysilicon portion being over the central portion of the nonboosted portion; (i) selectively etching the unetched thin oxide film to form a second undercut portion under the edge portion of the nonboosted portion and over the principal surface; (j) forming a silicate glass member with the second undercut portion filled with the silicate glass member and with the principal surface, an inner surface of the opening, and an outer surface of the insulator film covered with the silicate glass member, the silicate glass member containing impurities of the second conductivity type; (k) subjecting the silicate glass member to a first heat treatment to form an inner base region of a predetermined base depth in the semiconductor layer by making the impurities of the second conductivity type diffuse from the silicate glass member to the inner base region through the principal surface; (l) removing the silicate glass member so that only the silicate glass member filled in the second undercut portion remains unremoved; (m) forming in a second heated atmosphere an insulator spacer defining a contact hole therein with an outer surface of the insulator spacer brought into contact with the inner surface of the opening to thereby form a link base region in an outer part of the inner base region by making the impurities of the second conductivity type diffuse from the silicate glass member filled in the second undercut portion to the link base region through the principal surface in the second heated atmosphere, the link base region constituting the base region together with the outer base region and the inner base region; (n) forming an emitter leading polysilicon member with the insulator film covered with the emitter leading polysilicon member and with the contact hole filled with the emitter leading polysilicon member, the emitter leading polysilicon member being doped with impurities of the first conductivity type; and (o) subjecting the emitter leading polysilicon member to a second heat treatment to form the emitter region of a predetermined emitter depth less than the predetermined base depth in a central part of the inner base region by making the impurities of the first conductivity type diffuse from the emitter leading polysilicon member to the emitter region through the principal surface.

DESCRIPTION OF THE PREFERRED EMBODIMENTS

Figure 1:
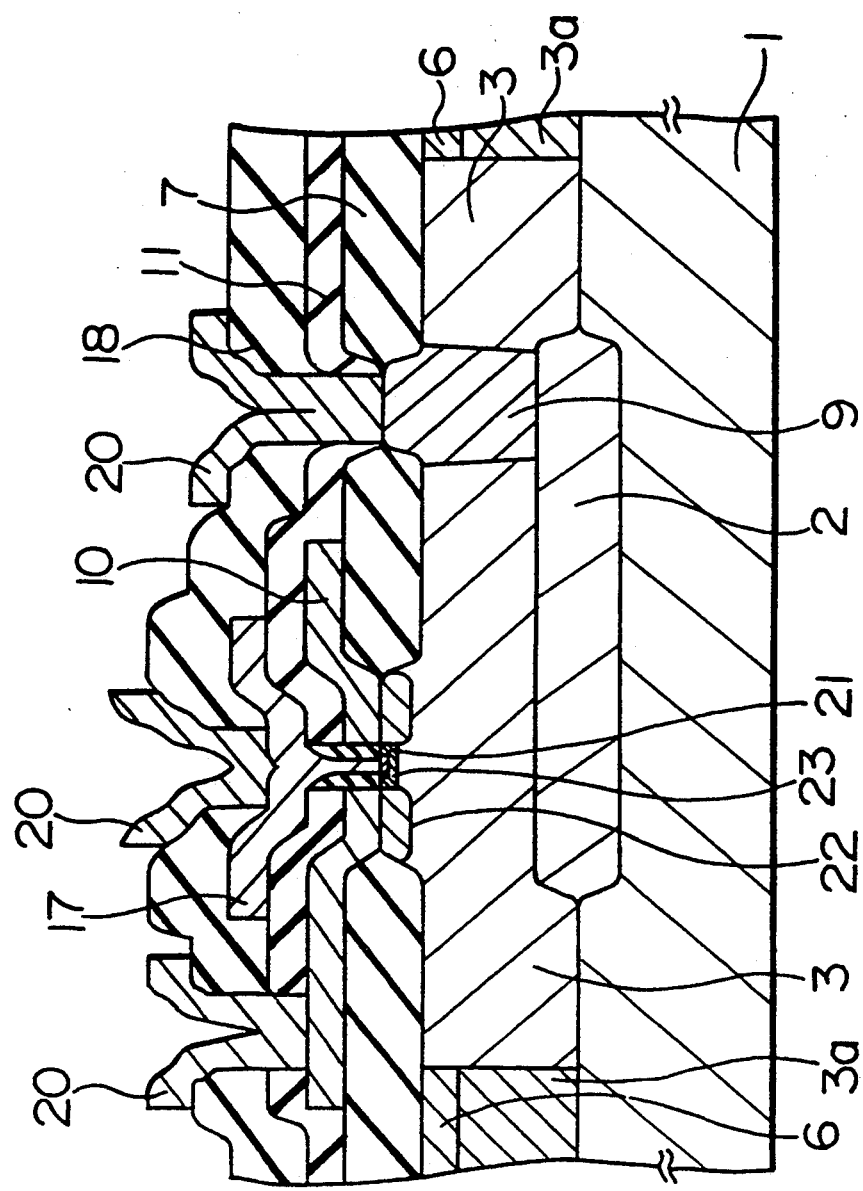
FIG. 1 is a cross-sectional view of a semiconductor device manufactured by a conventional method.

Referring to FIG. 1, description will first be made as regards a conventional manufacturing method of a semiconductor device for a better understanding of this invention. The semiconductor device comprises a bipolar transistor element including a collector region (a buried layer) 2, a base region including inner and outer base regions 21 and 22, and an emitter region 23. Each of the collector and the emitter regions 22 and 23 is of a first conductivity type. Each of the inner and the outer base regions 21 and 22 is of a second conductivity type which is different from the first conductivity type. In the illustrated bipolar transistor element, the first and the second conductivity types are an N type and a P type, respectively.

In order to realize a high speed operation of the bipolar transistor element, minimization of the bipolar transistor element in a transversal direction has been advanced so that the bipolar transistor element has smaller parasitic capacitances and a low base resistance. The illustrated bipolar transistor is proposed under the circumstances and realizes a self-alignment between the outer base region 22 and the emitter region 23 by using two polysilicon members which are a base leading polysilicom member 10 of the P type and an emitter leading polysilicon member 17 of the N type.

The illustrated bipolar transistor element is disadvantageous in that the base leading polysilicon member 10 is brought into contact with a large area of a planar surface of the outer base region 22. Inasmuch as the planar surface of the outer base region 22 becomes large, a collector-base capacitance $C_{CB}$ unavoidably increases.

Figure 2A:
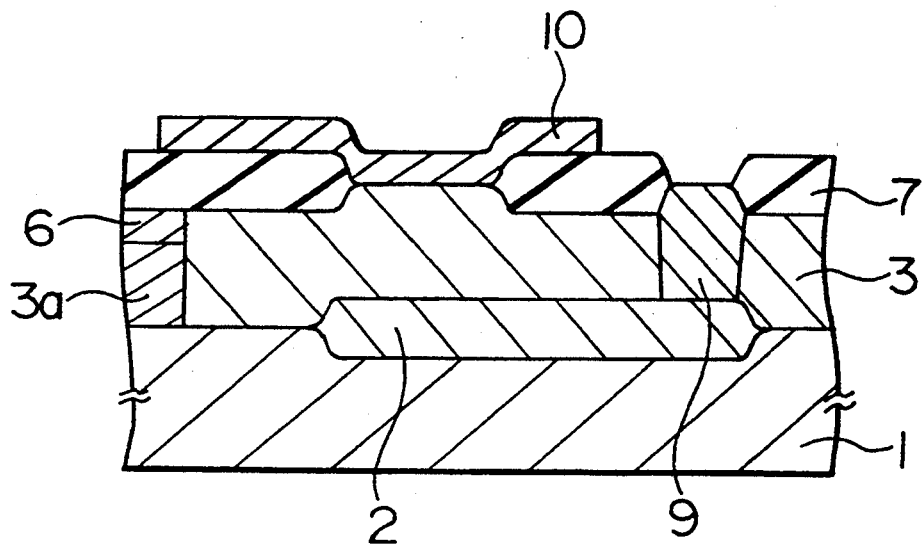
FIGS. 2A and 2B are cross-sectional views for use in describing a manufacturing process sequence of the semiconductor device illustrated in FIG. 1.
Figure 2B:
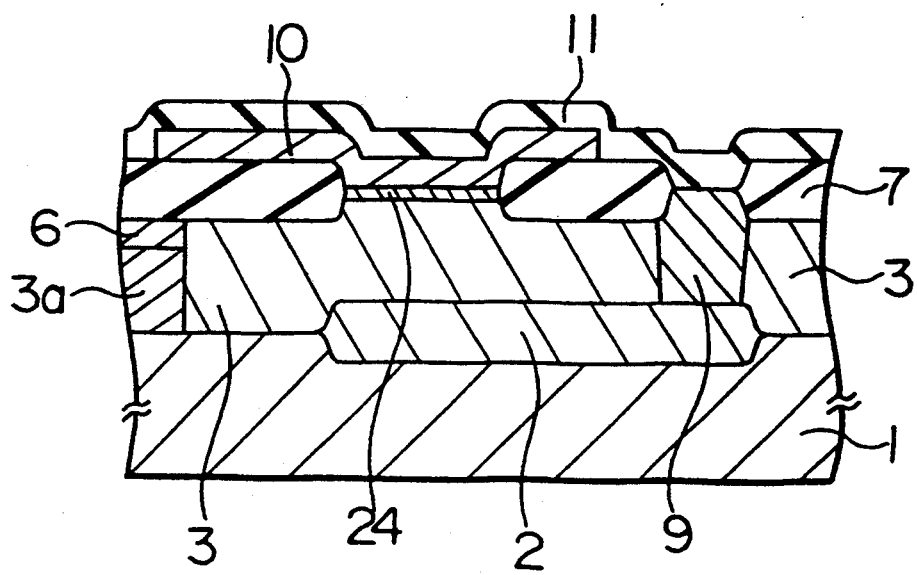

Turning to FIGS. 2A and 2B with reference to FIG. 1 continued, the outer base region 22 is formed by making impurities diffuse from the base leading polysilicon member 10 to the outer base region 22. Therefore, the base leading polysilicon member 10 is doped with a great amount of the impurities of the P type. Inasmuch as the base leading polysilicon member 10 is formed on a planar surface on which the base region (that is, the inner and the outer base regions 21 and 22) should be formed as shown in FIG. 2A, the impurities of the P type are diffused from the base leading polysilicon member 10 towards the planar surface to form an impurity layer 24 (FIG. 2B) of the P type on the planar surface whenever the base leading polysilicon member 10 is left in a heated atmosphere and whenever the base leading polysilicon member 10 is subjected to a heat treatment. In FIG. 2B, an insulator film 11 is formed on the base leading polysilicon member 10 as an emitter-base layer insulating film in the heated atmosphere. In this event, the impurity layer 24 is formed on the planar surface. In order to realize a high speed bipolar transistor having a high cutoff frequency $f_T$, it is necessary to form a shallow inner base region 21. The impurity layer 24 it impossible to form the shallow inner base region 21.

The inner base region 21 will be called an intrinsic base region because the inner base region 21 has an impurity concentration which is lower than that of the outer base region 22.

Figure 3:
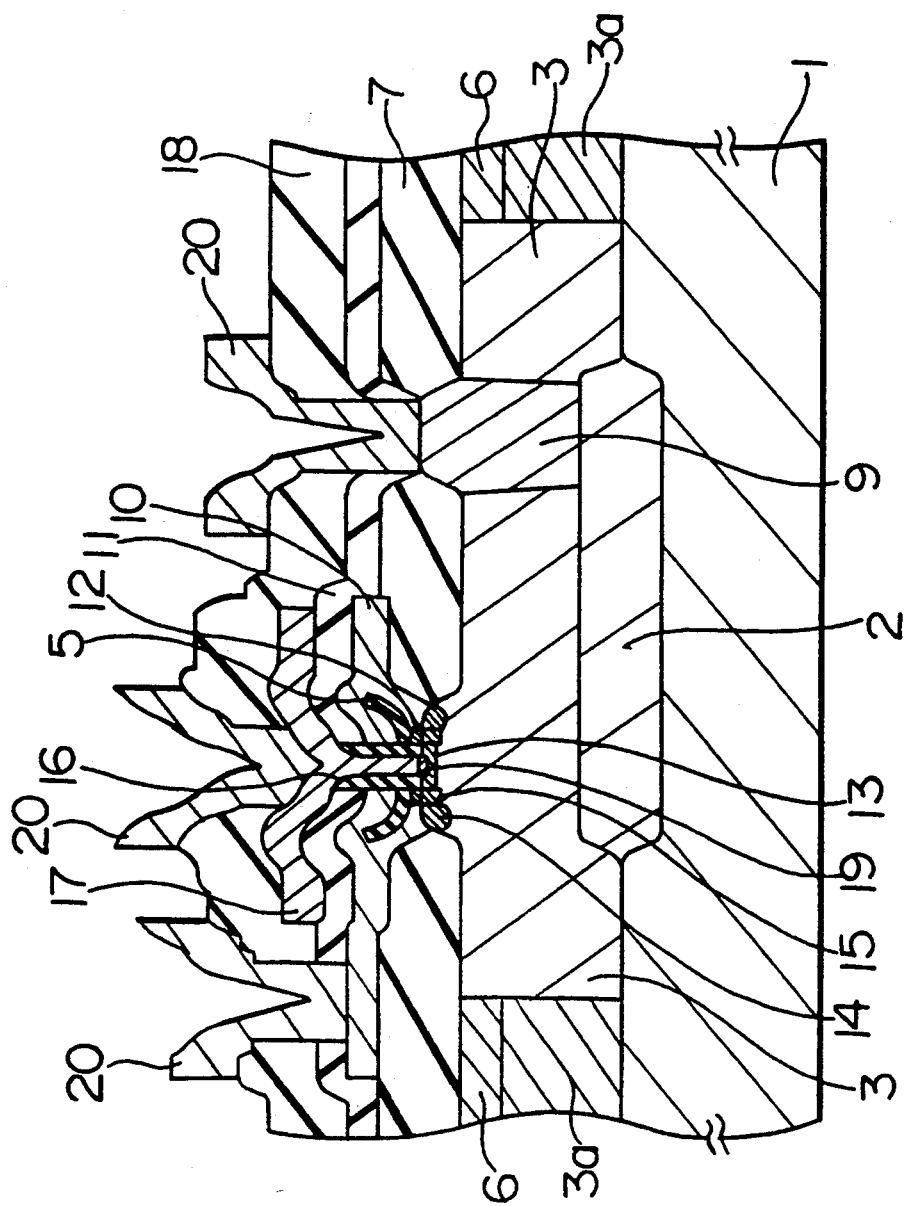
FIG. 3 is a cross-sectional view of a semiconductor device manufactured by a method according to a first embodiment of this invention.

Turning to FIG. 3, description will proceed to a semiconductor device manufactured by a method according to a first embodiment of this invention. The semiconductor device comprises similar parts designated by like reference numerals. In the semiconductor device, the base leading polysilicon member 10 is brought into contact with a corner portion of an outer base region 14. A link base region 15 is a link between an inner base region 13 and the outer base region 14. A boron silicate glass (BSG) member 12 is present on the link base region 15.

Figure 4A:
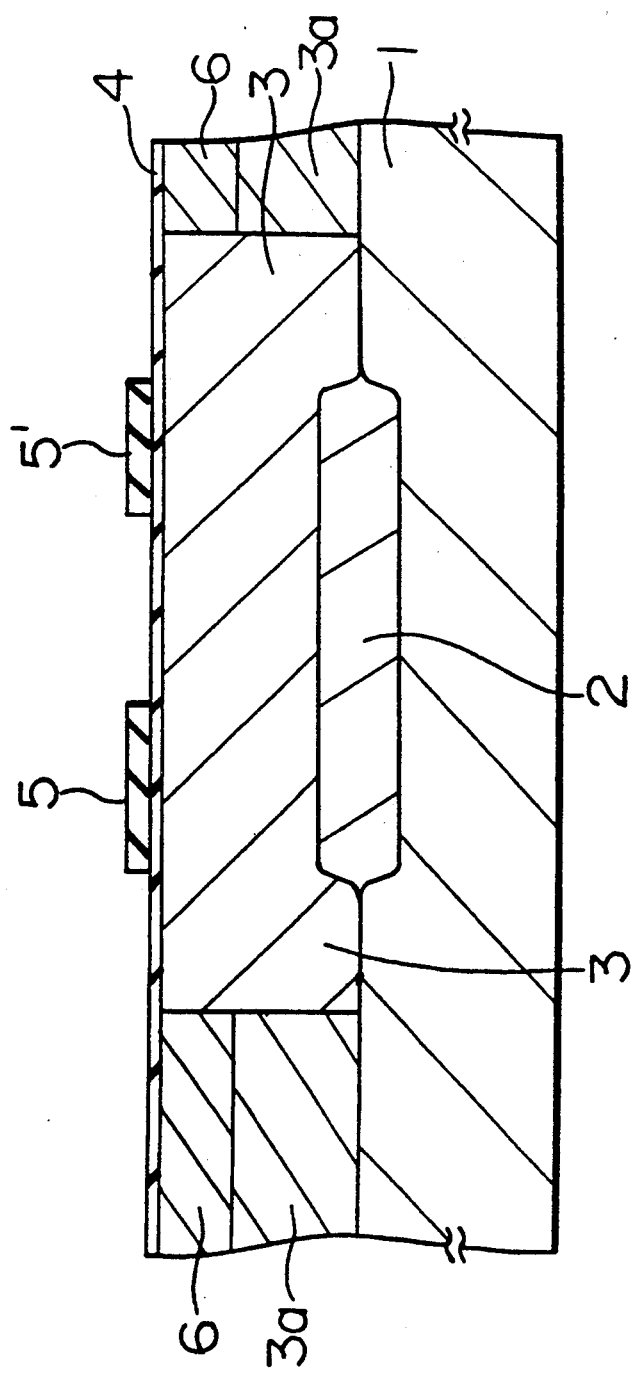
FIGS. 4A to 4K are cross-sectional views for use in describing a manufacturing process sequence of the semiconductor device illustrated in FIG. 3.

Turning to FIGS. 4A to 4K, description will proceed to the method according to the first embodiment of this invention. In FIG. 4A, a semiconductor member is prepared which comprises a silicon substrate 1, the collector region 2, and an epitaxial silicon layer 3. The silicon substrate 1 of the P type has a substrate surface. The epitaxial silicon layer 3 of the N type has a principal surface and an opposite surface opposite to the principal surface. The collector region 2 of the N type is interposed between the substrate surface and the opposite surface.

More specifically, the collector region 2 is a buried arsenic layer having impurities of an N+ type and is formed on the substrate surface. The epitaxial silicon layer 3 has a thickness of 0.5-2 μm and is formed on the substrate surface and on the collector region 2. The epitaxial silicon layer 3 has impurities of the N type. An element isolation region 3a having impurities of the P type and a boron region 6 of an P+ type are successively formed to achieve an element isolation.

A thin silicon oxide film 4 of a predetermined film thickness of 30-80 nm is formed on the principal surface by a heat oxidation process.

Silicon nitride films 5 and 5' have a thickness of 50-150 nm and are selectively formed on preselected parts of the thin silicon oxide film 4 with a remaining part of the thin silicon oxide film 4 exposed as an exposed part. More specifically, a silicon nitride film is formed on an entire surface of the thin silicon oxide film 4. The silicon nitride film is selectively etched so that the silicon nitride films 5 and 5' remain.

The exposed part of the thin silicon oxide film 4 is subjected to an oxidation treatment (more specifically, a heat oxidation process) by making use of the silicon nitride films 5 and 5' as an oxidation mask.

Figure 4B:
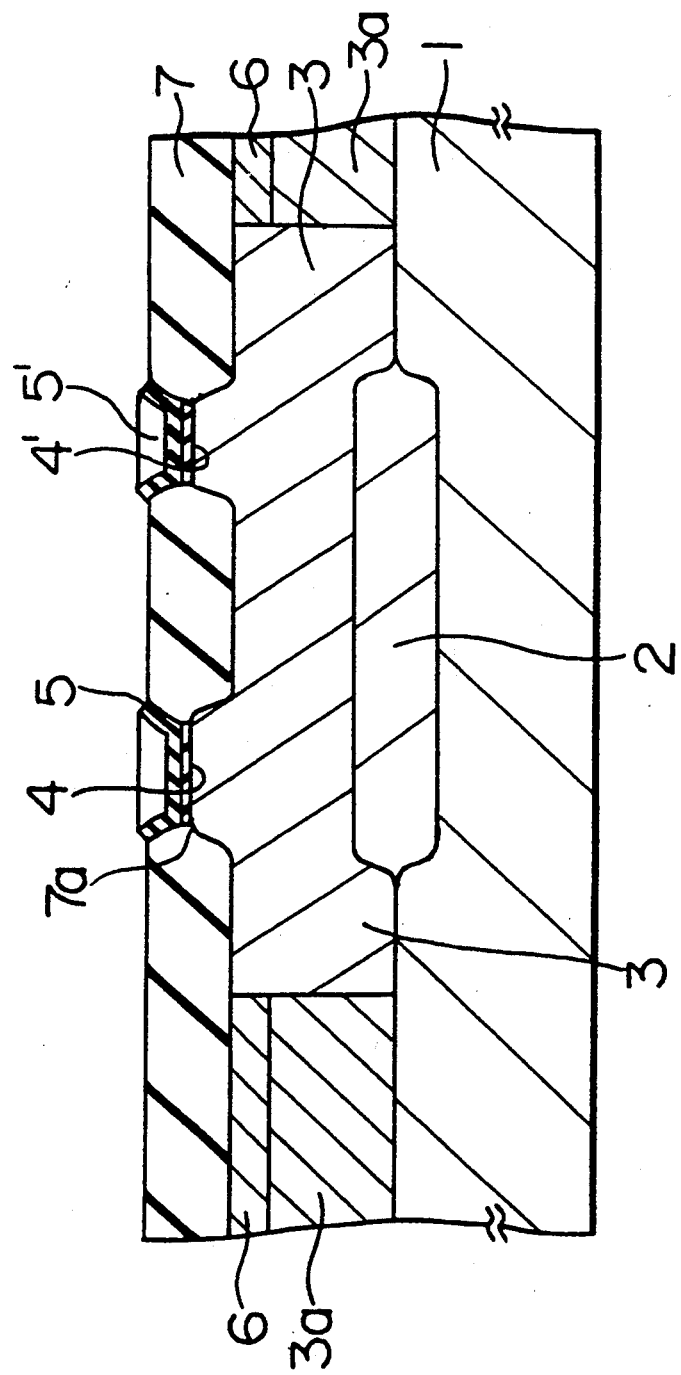

In FIG. 4B, the exposed part is changed by the heat oxidation process to a thick field silicon oxide layer 7 of a predetermined layer thickness of 400-700 nm.

Attention will be directed to the thick field silicon oxide layer 7. The thick field silicon oxide layer 7 has a beaked edge portion 7a which is called a bird's beak portion in the art. A nitride edge portion of the silicon nitride film 5 or 5' is boosted up as a boosted portion by an upper part of the beaked edge portion 7a. A remaining portion of the silicon nitride film 5 or 5' is kept as a nonboosted portion as it stands. The thin silicon oxide film 4 or 4' which exists under the nonboosted portion and is surrounded by the beaked edge portion 7a is kept unchanged as a thin oxide film.

Figure 4C:
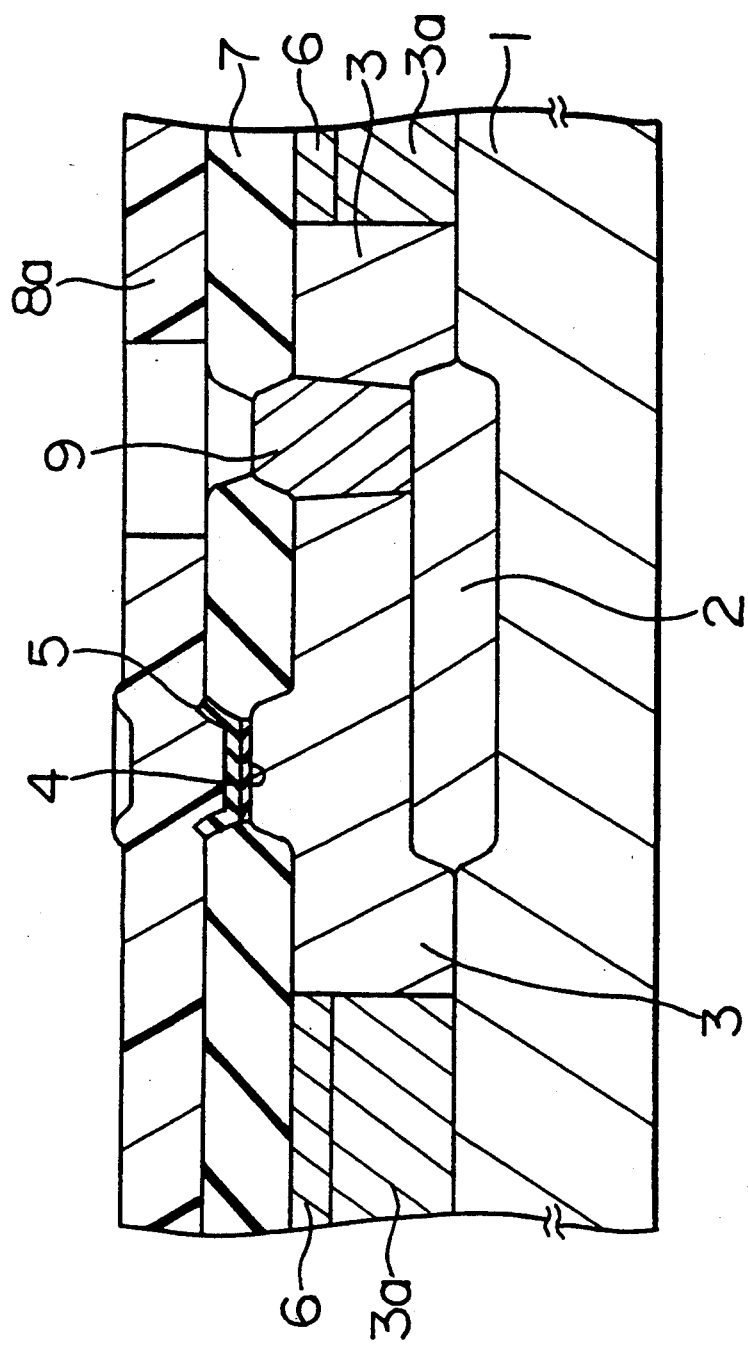

In FIG. 4C, the silicon nitride film 5' and the thin silicon oxide film 4' are removed in the known manner. A collector leading layer 9 of the N+ type is formed by an ion implantation process of, for example, phosphorus and a heat treatment by using a photoresist 8a as a mask.

Figure 4D:
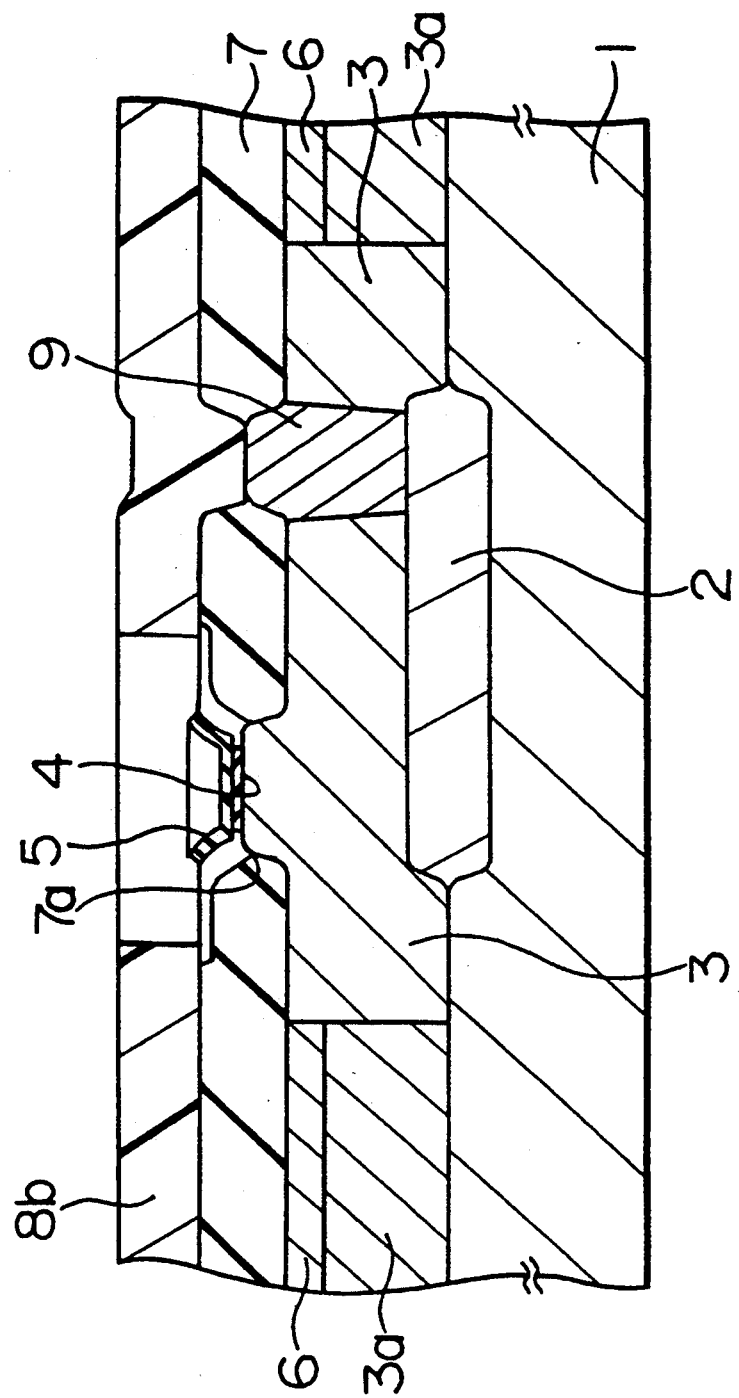

In FIG. 4D, the upper part of the beaked edge portion 7a and an oxide edge portion of the thin oxide film 4 are selectively etched by an isotropic wet etching process using the silicon nitride film 5 and another photoresist 8b as an etching mask. In this event, the photoresist 8b is formed on the thick field silicon oxide layer 7 with a distance of 1–3 μm left between the photoresist 8b and the silicon nitride film 5. A first undercut portion is thereby formed under the boosted portion of the silicon nitride film 5 and over the principal surface of the epitaxial silicon layer 3. A remaining part of the thin oxide film 4 is kept unetched as an unetched thin oxide film. Thereafter, the photoresist 8b is removed.

Figure 4E:
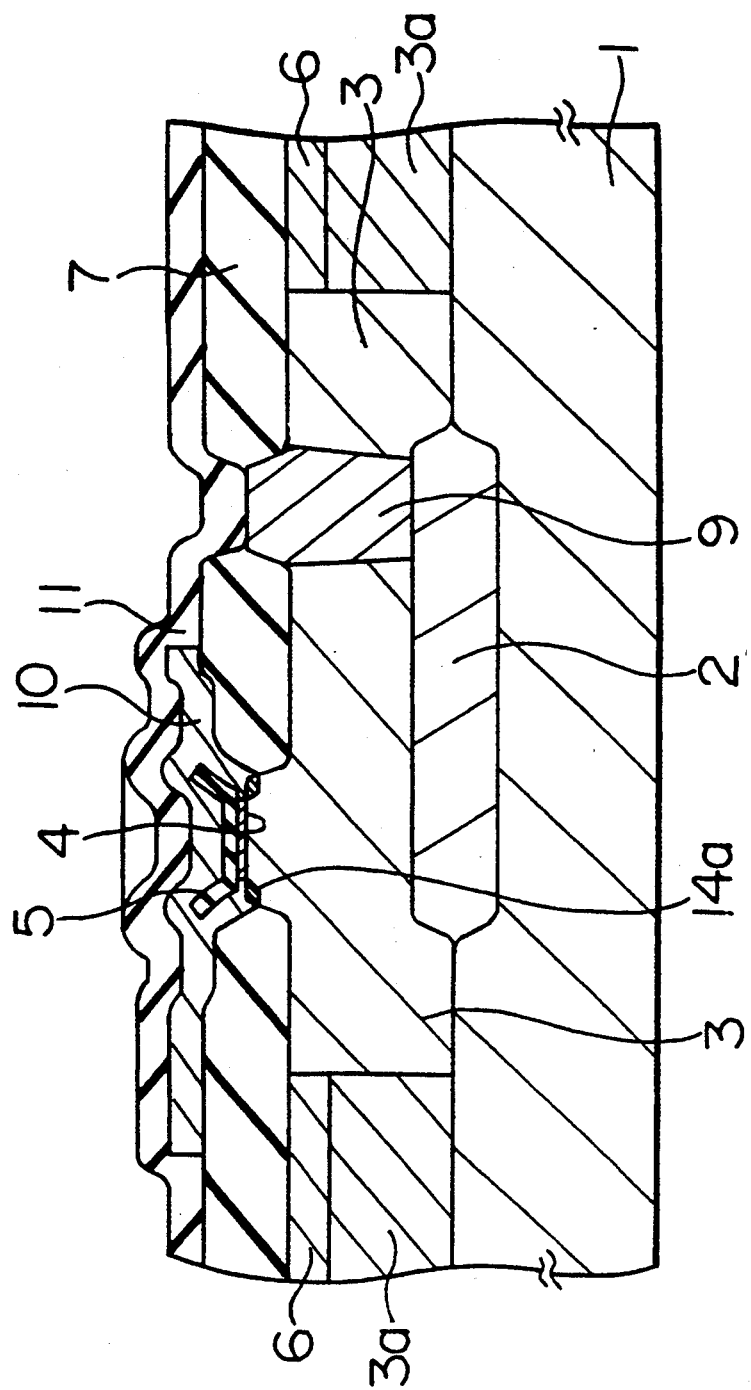

In FIG. 4E, the base leading polysilicon member 10 having a thickness of 100–300 nm is formed by a photolithography technique and an anisotropic dry etching process with the silicon nitride film 5 and the thick field silicon oxide layer 7 covered with the base leading polysilicon member 10 and with the first undercut portion filled with the base leading polysilicon member 10. The base leading polysilicon member 10 is doped with impurities of the P type. The insulator film 11 is formed on the base leading polysilicon member 10 as the emitter-base layer insulating film in a first heated atmosphere. In this event, an outer base region 14a is formed in the epitaxial silicon layer 3 by making the impurities of the P type diffuse from the base leading polysilicon member 10 to the outer base region 14a through the principal surface in the first heated atmosphere.

Figure 4F:
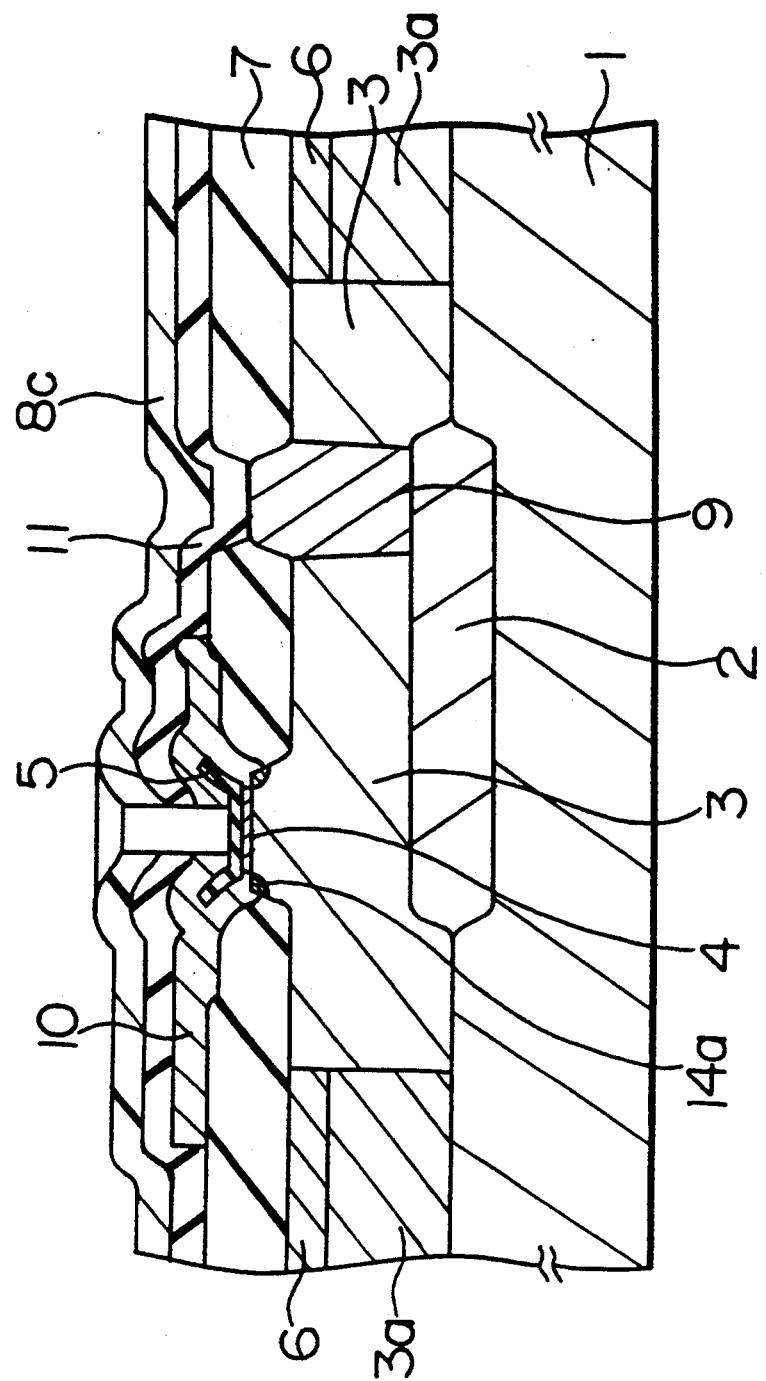

In FIG. 4F, a predetermined insulator portion of the insulator film 11 and a predetermined polysilicon portion of the base leading polysilicon member 10 are selectively etched by an anisotropic etching process using still another photoresist 8c as an etching mask. In this event, a combination of the silicon nitride film 5 and the unetched thin oxide film 4 acts as a protect film which protects the epitaxial silicon layer 3. Thereafter, a central portion of the nonboosted portion of the silicon nitride film 5 is selectively etched by the anisotropic etching process using the photoresist 8c to form an opening which serves as a part of an emitter opening window. In this event, an edge portion of the nonboosted portion is kept unetched. The predetermined insulator portion of the insulator film 11 and the predetermined polysilicon portion of the base leading polysilicon member 10 is positioned over the central portion of the nonboosted portion of the silicon nitride film 5.

Figure 4G:
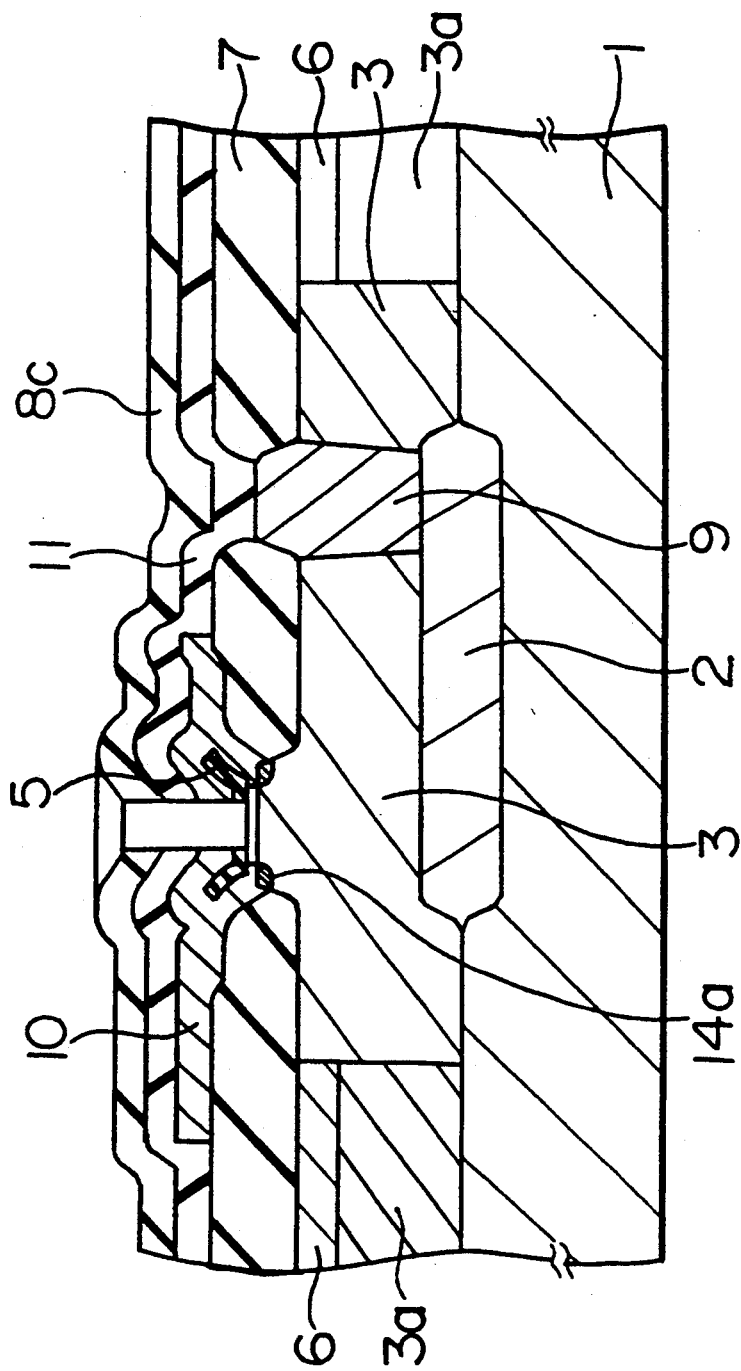

In FIG. 4G, the entire unetched thin oxide film 4 is selectively etched by an isotropic etching process using the photoresist 8c to form a second undercut portion under the edge portion of the nonboosted portion of the silicon nitride film 5 and over the principal surface of the epitaxial silicon layer 3. After that, the photoresist 8c is removed.

Figure 4H:
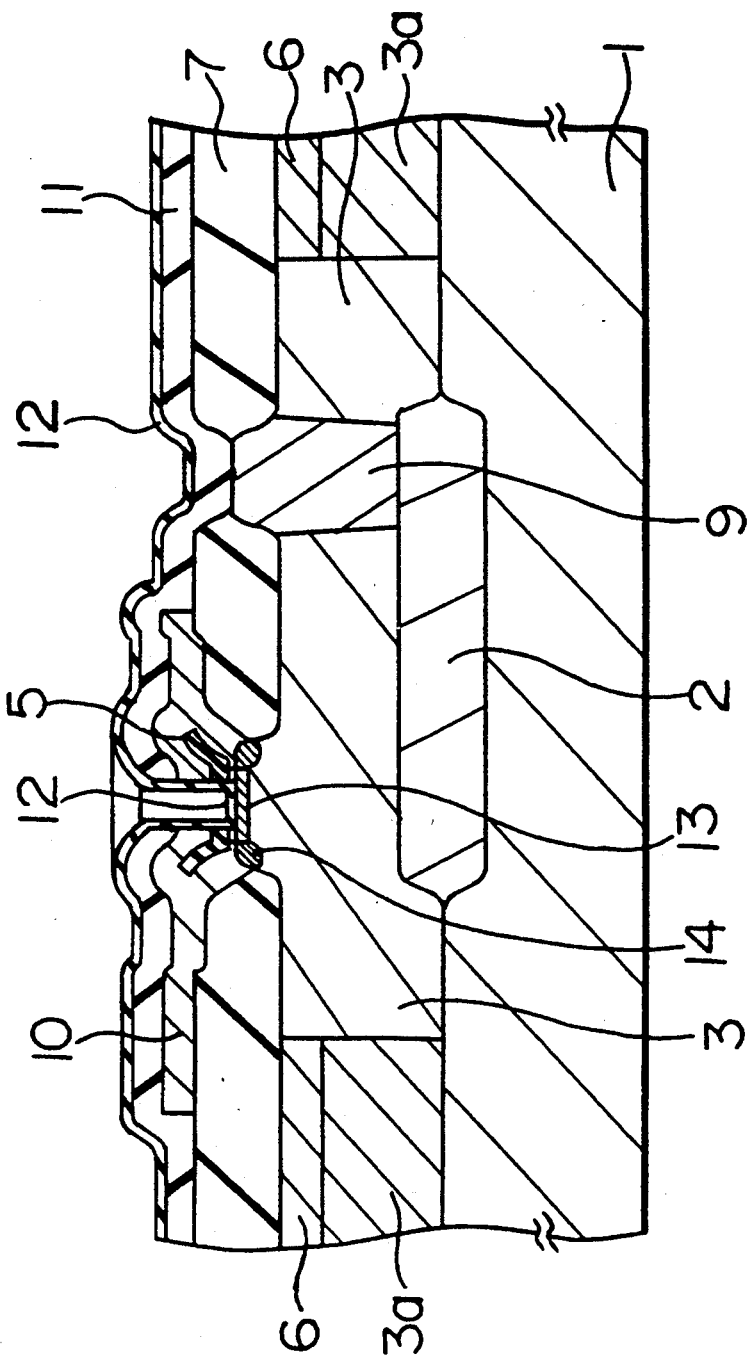

In FIG. 4H, the boron silicate glass (BSG) member 12 is formed with the second undercut portion filled with the boron silicate glass member 12 and with the principal surface of the epitaxial silicon layer 3, an inner surface of the opening, and an outer surface of the insulator film 11 covered with the boron silicate glass member 12. The boron silicate glass member 12 contains 5–15 mol % boron as impurities of the P type.

Thereafter, the boron silicate glass member 12 is subjected to a first heat treatment. The inner base region 13 of a predetermined base depth is thereby formed in the epitaxial silicon layer 3 by making the impurities of the P type diffuse from the boron silicate glass member 12 to the inner base region 13 through the principal surface of the epitaxial silicon layer 3.

Simultaneously, the outer base region 14 is entirely formed by making the impurities of the P type diffuse from the base leading polysilicon member 10 to the outer base region 14 through the principal surface by the first heat treatment.

Figure 4I:
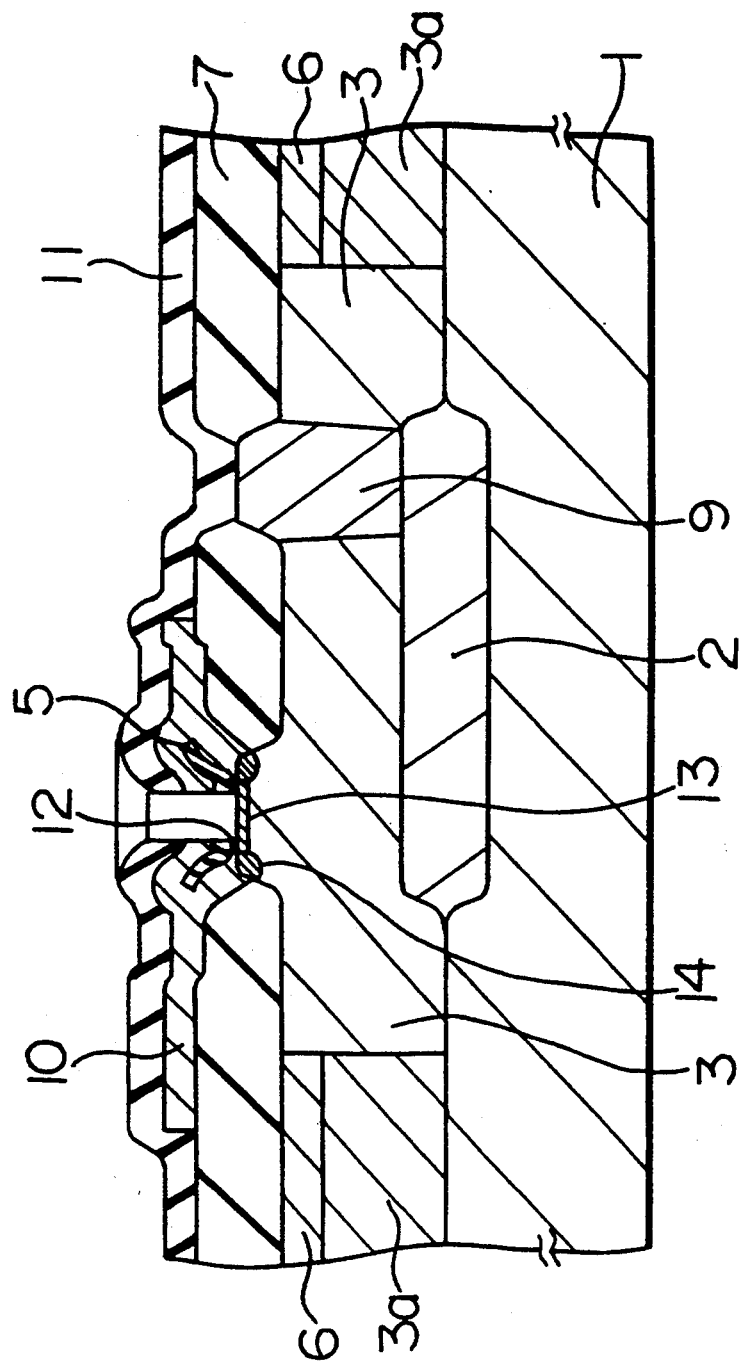

In FIG. 4I, the boron silicate glass member 12 is removed by the isotropic etching process. In this event, only the boron silicate glass member 12 filled in the second undercut portion remains unremoved.

Figure 4J:
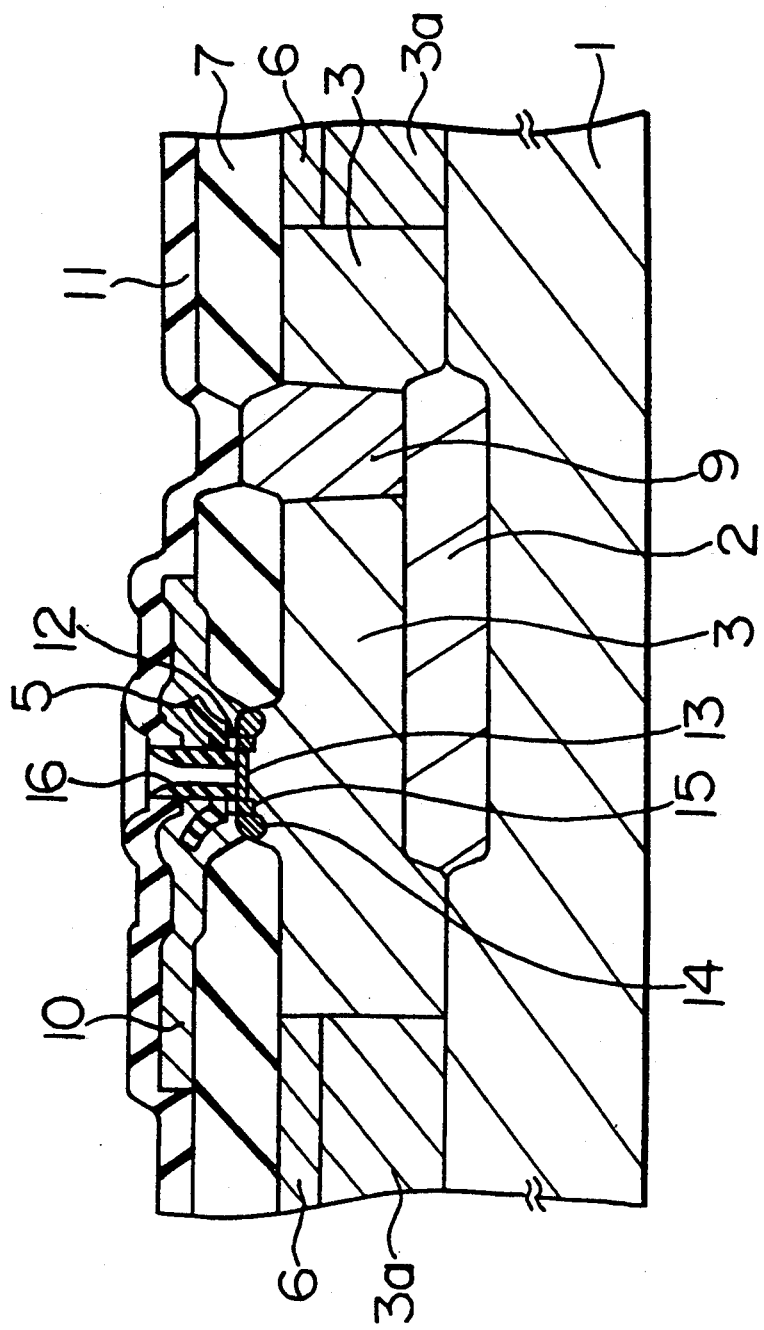
Figure 4K:
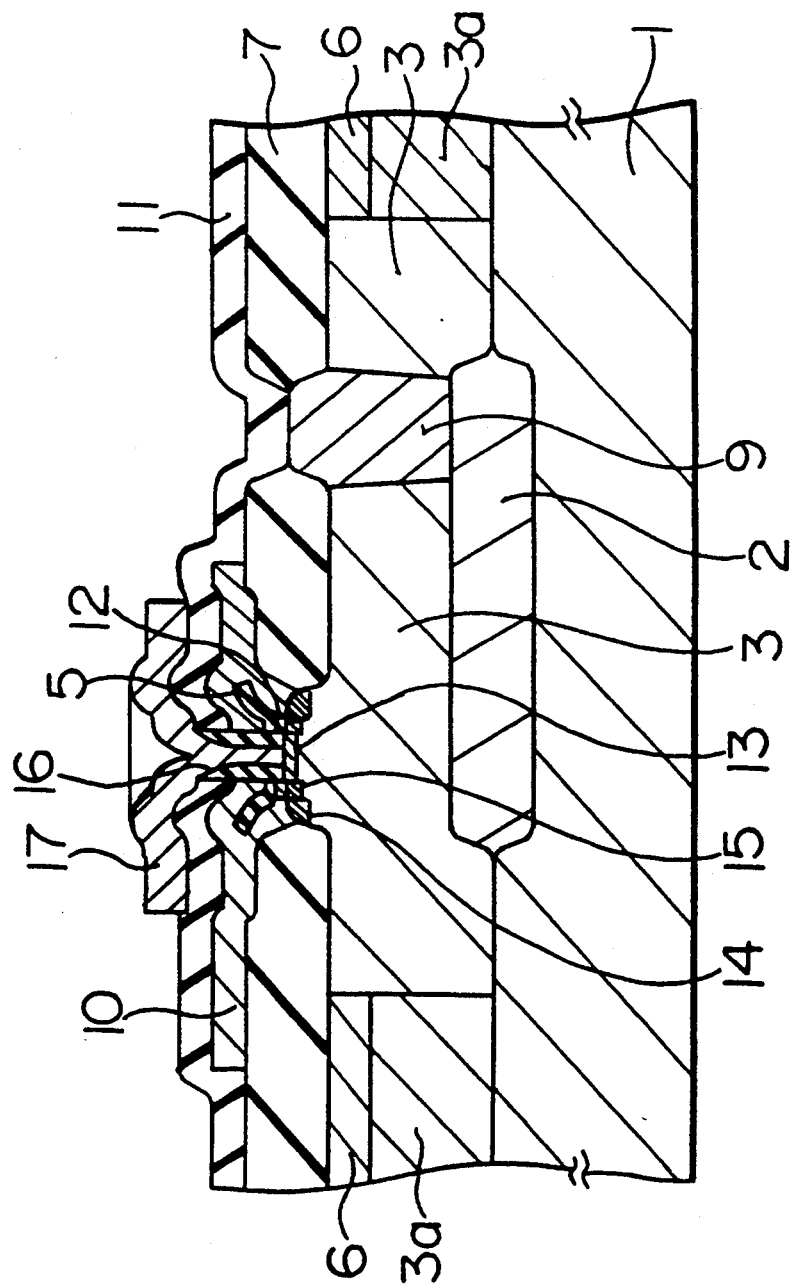

In FIG. 4J, an insulator spacer 16 of, for example, a silicon nitride spacer is formed in a second heated atmosphere with an outer surface of the insulator spacer 16 brought into contact with the inner surface of the opening. The second heated atmosphere is defined by a growth temperature of, for example, a silicon nitride of the insulator spacer 16. The insulator spacer 16 defines therein a contact hole which also serves as the emitter opening window. The link base region 15 is thereby formed in an outer part of the inner base region 13 by making the impurities of the P type diffuse from the boron silicate glass member 12 filled in the second undercut portion to the link base region 15 through the principal surface of the epitaxial silicon layer 13 in the second heated atmosphere. The link base region 15 has an impurity concentration which is higher than that of the inner base region 13 and is lower than that of the outer base region 14. The link base region 15 constitutes the base region together with the outer base region 14 and the inner base region 13.

In FIG. 2K, the emitter leading polysilicon member 17 having a thickness of 100–400 nm is formed by the photolithography technique and the anisotropic etching process with the first insulator film 11 covered with the emitter leading polysilicon member 17 and with the contact hole filled with the emitter leading polysilicon member 17. The emitter leading polysilicon member 17 is doped with impurities of the N type by an ion implantation process of, for example, arsenic which is selected as the impurities of the N type.

Tuning back to FIG. 3, an insulator 18 is formed on the emitter leading polysilicon member 17. Subsequently, the emitter leading polysilicon member 17 is subjected to a second heat treatment. An emitter region 19 is thereby formed in a central part of the inner base region 13 by making the impurities of the N type diffuse from the emitter leading polysilicon member 17 to the emitter region 19 through the principal surface of the epitaxial silicon layer 3. The emitter region 19 has a predetermined emitter depth which is less than the predetermined base depth of the inner base region 13.

After that, three contact holes for the collector leading layer 9, the base leading polysilicon member 10, and the emitter leading polysilicon member 17 are formed in the known manner. Three metal members 20 of, for example, aluminium are filled in the contact holes in the manner also known in the art.

Figure 5:
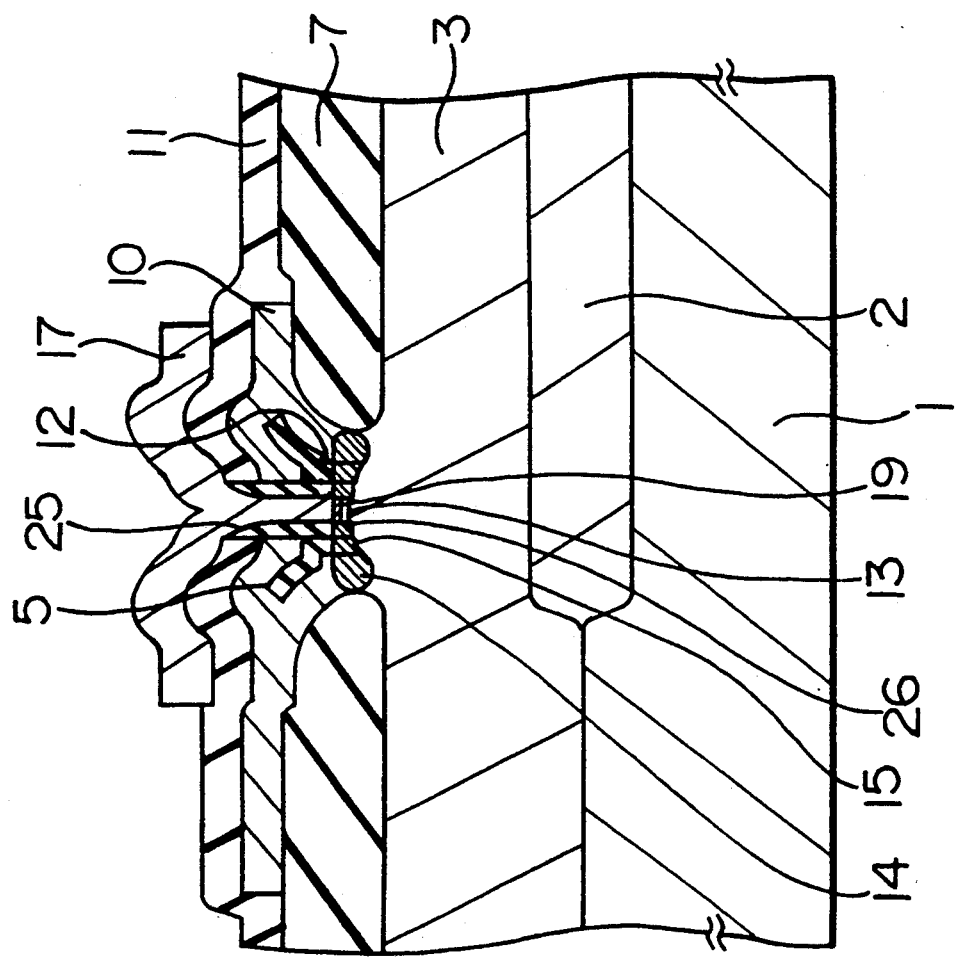
FIG. 5 is a cross-sectional view of a semiconductor device manufactured by a method according to a second embodiment of this invention.

Turning to FIG. 5, description will proceed to a semiconductor device manufactured by a method according to the second embodiment of this invention. The semiconductor device is similar to the semiconductor device of FIG. 3 except that another insulator spacer 25 is used instead of the insulator spacer 16 and that an additional link base region 26 is formed under the insulator spacer 25.

The insulator spacer 25 consists of a boron silicate glass (BSG) which contains boron as impurities of the P type. When the boron silicate glass of the insulator spacer 25 is subjected to the above-mentioned second heat treatment, the additional link base region 26 is formed in an intermediate part between the outer and the central parts of the inner base region 13 by making the impurities of the P type (that is, boron) diffuse from the boron silicate glass of the insulator spacer 25 to the additional link base region 26 through the principal surface of the epitaxial silicon layer 3. The additional link base region 26 constitutes the base region together with the outer base region 14, the inner base region 13, and the link base region 15.

The additional link base region 26 has an impurity concentration which is higher than that of the inner base region 13 and is lower than that of the link base region 15. With the additional link base region 26, it is possible to reduce a base resistance component under the insulator spacer 25.

In FIGS. 3 and 5, the description will be made as regards merits of this invention. Inasmuch as the silicon nitride film 5 has the boosted portion, it is possible to bring the base leading polysilicon member 10 into contact with the corner portion of the outer base region 14. That is, the base leading polysilicon member 10 is brought into contact with a small area of a planar surface (or the principal surface) of the outer base region 14. Inasmuch as the planar surface of the outer base region 14 becomes small, a collector-base capacitance $C_{CB}$ decreases without increasing the base resistance. In fact, the bipolar transistor element of each of FIGS. 3 and 5 has a collector-base capacitance $C_{CB}$ of 3.87 fF (femto-farad) when the silicon nitride film 5 has a width of 0.8 μm and a length of 2 μm. On the other hand, the bipolar transistor element of FIG. 1 has a collector-base capacitance $C_{CB}$ of 37.1 fF under the same condition.

Inasmuch as the silicon nitride film 5 prevents the impurities of the base leading polysilicon member 10 from diffusing into the epitaxial silicon layer 3 under the silicon nitride film 5 when the insulator film 11 is formed on the base leading polysilicon member 10 in FIG. 4E, it is possible to form a shallow inner base region 13 in FIG. 4H. This makes it possible to obtain the bipolar transistor element having a high cutoff frequency $f_T$. In fact, the bipolar transistor element of each of FIGS. 3 and 5 has a cutoff frequency $f_T$ of 18 GHz. On the other hand, the bipolar transistor element of FIG. 1 has a cutoff frequency $f_T$ of 6 GHz. It is therefore possible to obtain a high speed bipolar transistor element.

Inasmuch as the link base region 15 has an impurity concentration which is higher than that of the inner base region 13 and is lower than that of the outer base region 14, it is possible to reduce the base resistance without decreasing the cutoff frequency $f_T$. In fact, the base resistance of 257.4 ohms is obtained in the bipolar transistor element of FIG. 3. In this case, the inner, the link, and the outer base regions 13, 15, and 14 have resistances of 150.9, 55.8, and 30.2 ohms, respectively. The additional link base region 26 of the bipolar transistor element of FIG. 5 has a resistance of about 90 ohms. In the conventional bipolar transistor element of FIG. 1, the base resistance of 353.2 ohms is obtained.

Inasmuch as the bipolar transistor element of each of FIGS. 3 and 5 has the link base region 15, the outer base region 14 can be located far from the inner base region 13. Therefore, a forward direction voltage of a PN junction between the base and the emitter regions can be kept without reducing the voltage.

What is claimed is:

1. A method of manufacturing a semiconductor device comprising a bipolar transistor element including a collector region, a base region, and an emitter region, each of said collector and said emitter regions being of a first conductivity type, said base region being of a second conductivity type which is different from said first conductivity type, said method comprising:

preparing a semiconductor member which comprises a semiconductor substrate of said second conductivity type having a substrate surface, a semiconductor layer of said first conductivity type having a principal surface and an opposite surface opposite to said principal surface, and said collector region interposed between said substrate surface and said opposite surface;

forming on said principal surface a semiconductor oxide film of a first film thickness;

selectively forming a semiconductor nitride film on a selected part of said semiconductor oxide film with a remaining part of said semiconductor oxide film exposed as an exposed part;

subjecting said exposed part of the semiconductor oxide film to an oxidation treatment by making use of said semiconductor nitride film as an oxidation mask to change said exposed part to a field semiconductor oxide layer of a second layer thickness greater than said first film thickness so that said field semiconductor oxide layer has a beaked edge portion with a nitride edge portion of said semiconductor nitride film boosted up as a boosted portion by an upper part of said beaked edge portion and with a remaining portion of said semiconductor nitride film kept as a nonboosted portion as it stands and that the semiconductor oxide film which exists under said nonboosted portion and is surrounded by said beaked edge portion is kept unchanged as an oxide film;

selectively etching said upper part of said beaked edge portion and an oxide edge portion of said oxide film by making use of said semiconductor nitride film having said boosted portion as an etching mask to form a first undercut portion under said boosted portion and over said principal surface with a remaining portion of said oxide film kept unetched as an unetched oxide film;

forming a base leading polysilicon member with said semiconductor nitride film and said field semiconductor oxide layer covered with said base leading polysilicon member and with said first undercut portion filled with said base leading polysilicon member, said base leading polysilicon member being doped with impurities of said second conductivity type;

forming an insulator film on said base leading polysilicon member in a first heated atmosphere to thereby form an outer base region in said semiconductor layer by making the impurities of said second conductivity type diffuse from said base leading polysilicon member to said outer base region through said principal surface in said first heated atmosphere;

selectively etching an insulator portion of said insulator film, a polysilicon portion of said base leading polysilicon member, and a central portion of said nonboosted portion of the semiconductor nitride film to form an opening, an edge portion of said nonboosted portion being kept unetched, said insulator portion and said polysilicon portion being over said central portion of the nonboosted portion;

selectively etching said unetched oxide film to form a second undercut portion under said edge portion of said nonboosted portion and over said principal surface;

forming a silicate glass member with said second undercut portion filled with said silicate glass member and with said principal surface, an inner surface of said opening, and an outer surface of said insulator film covered with said silicate glass member, said silicate glass member containing impurities of said second conductivity type;

subjecting said silicate glass member to a first heat treatment to form an inner base region of a base depth in said semiconductor layer by making the impurities of said second conductivity type diffuse from said silicate glass member to said inner base region through said principal surface;

removing said silicate glass member so that only the silicate glass member filled in said second undercut portion remains unremoved;

forming in a second heated atmosphere an insulator spacer defining a contact hole therein with an outer surface of said insulator spacer brought into contact with the inner surface of said opening to thereby form a link base region in an outer part of said inner base region by making said impurities of said second conductivity type diffuse from said silicate glass member filled in said second undercut portion to said link base region through said principal surface in said second heated atmosphere, said link base region constituting said base region together with said outer base region and said inner base region;

forming an emitter leading polysilicon member with said insulator film covered with said emitter leading polysilicon member and with said contact hole filled with said emitter leading polysilicon member, said emitter leading polysilicon member being doped with impurities of said first conductivity type; and subjecting said emitter leading polysilicon member to a second heat treatment to form said emitter region of an emitter depth less than said base depth in a central part of said inner base region by making the impurities of said first conductivity type diffuse from said emitter leading polysilicon member to said emitter region through said principal surface.

2. A method as claimed in claim 1, wherein said semiconductor substrate is a silicon substrate.

3. A method as claimed in claim 2, wherein said semiconductor layer is an epitaxial silicon layer.

4. A method as claimed in claim 3, wherein said semiconductor oxide film is a silicon oxide film.

5. A method as claimed in claim 4, wherein said field semiconductor oxide layer is a field silicon oxide layer.

6. A method as claimed in claim 1, wherein said semiconductor nitride film is a silicon nitride film.

7. A method as claimed in claim 1, wherein said insulator film is a silicon oxide film.

8. A method as claimed in claim 1, wherein said silicate glass member is a boron silicate glass member.

9. A method as claimed in claim 1, wherein said insulator spacer is a silicon nitride spacer.

10. A method as claimed in claim 1, wherein said link base region has an impurity concentration which is higher than that of said inner base region and is lower than that of said outer base region.

11. A method as claimed in claim 1, wherein said insulator spacer consists of a silicate glass containing impurities of said second conductivity type.

12. A method as claimed in claim 11, wherein said last-mentioned subjecting step is for furthermore subjecting said silicate glass to said second heat treatment to form an additional link base region in an intermediate part between the outer and the central parts of said inner base region by making the impurities of said second conductivity type diffuse from the silicate glass of said insulator spacer to said additional link base region through said principal surface, said additional link base region constituting said base region together with said outer base region, said inner base region, and said link base region.

13. A method as claimed in claim 12, wherein said insulator spacer consists of a boron silicate glass.

14. A method as claimed in claim 12, wherein said link base region has an impurity concentration which is higher than that of said inner base region and is lower than that of said outer base region, said additional link base region having another impurity concentration which is higher than that of said inner base region and is lower than that of said link base region.

* * * * *